(12) United States Patent
Kranabenter

(10) Patent No.: US 7,907,005 B2
(45) Date of Patent: Mar. 15, 2011

(54) DEMODULATION CIRCUIT FOR ASK CODED OR AMPLITUDE MODULATED SIGNALS AS WELLS AS NFC AND RFID DEVICES COMPRISING THE SAME

(75) Inventor: Helmut Kranabenter, Graz (AT)

(73) Assignee: NXP B.V., Eindhoven (NL)

( * ) Notice: Subject to any disclaimer, the term of this patent is extended or adjusted under 35 U.S.C. 154(b) by 48 days.

(21) Appl. No.: 12/524,669

(22) PCT Filed: Jan. 15, 2008

(86) PCT No.: PCT/IB2008/050132
§ 371 (c)(1),
(2), (4) Date: Jul. 27, 2009

(87) PCT Pub. No.: WO2008/093254
PCT Pub. Date: Aug. 7, 2008

(65) Prior Publication Data
US 2009/0309652 A1 Dec. 17, 2009

(30) Foreign Application Priority Data
Jan. 31, 2007 (EP) .................... 07002045

(51) Int. Cl.
H03D 1/00 (2006.01)
H03D 1/22 (2006.01)
H03D 1/24 (2006.01)
H03K 9/00 (2006.01)
H03K 9/02 (2006.01)

(52) U.S. Cl. .......... 329/311; 329/361; 375/320; 375/353

(58) Field of Classification Search .................. 329/311, 329/347, 358, 361, 362; 375/320, 321, 340, 375/353
See application file for complete search history.

(56) References Cited

U.S. PATENT DOCUMENTS
4,253,066 A * 2/1981 Fisher et al. .................. 329/362

FOREIGN PATENT DOCUMENTS
EP 0412427 A 2/1991
WO 97/48180 A 12/1997
* cited by examiner Primary Examiner — David Mis

(57) ABSTRACT

Conventional modulation envelope demodulators for amplitude modulated signals (e.g. ASK coded signals RX) contain rectifier elements which extract a baseband signal BB. Disadvantageously, due to a non-linear characteristic of the rectifier elements, an amplitude of the baseband signal BB depends on an amplitude of the high-frequent carrier signal. The present invention discloses an improved demodulation circuit for demodulating of ASK coded or amplitude modulated signals. This is achieved by using a sampling mixer 4 and a phase adjusting regulation loop (5) by means of which the sampling of the ASK coded signal RX at its maxima is performed with high accuracy. Due to the absence of any rectifying elements, the baseband signal BB can be fully extracted from the ASK coded signals RX.

13 Claims, 3 Drawing Sheets

DEMODULATION CIRCUIT FOR ASK CODED OR AMPLITUDE MODULATED SIGNALS AS WELLS AS NFC AND RFID DEVICES COMPRISING THE SAME

FIELD OF THE INVENTION

The invention relates to a demodulation circuit for ASK coded or amplitude modulated (AM) signals comprising a circuit input being adapted to receive an ASK coded or AM signal comprising a carrier signal being ASK coded according to a base band signal or amplitude modulated.

The invention further relates to an NFC device and to an RFID transponder.

The invention is particularly related to Near Field Communication (NFC) devices as described in ISO 18092. For communication between two devices an RF field with 13.56 MHz carrier is used. One device has its transmitter active and generates that field via an antenna while the second device receives the signal through inductive coupling between its own antenna and that of the first device. During communication this RF field is modulated with ASK with a modulation index depending on the current communication mode (see ISO 18092) by the transmitting device. For the receiving device a demodulation method and implementation is described here.

The invention will be applied in Near Field Communication integrated circuits (ICs) to implement card mode, i.e. the device is in the 13.56 MHz field of another device which is generating that field and is sending data or a command by means of ASK modulation. However, it has to be emphasized that the present invention is generally applicable to the demodulation of any form of ASK and AM signals.

BACKGROUND OF THE INVENTION

There are several difficulties in implementing demodulators for such ASK coded or AM signals.

First, the signal received at a receiver input RX (see FIG. 2) has a quite large dynamic range. The carrier signal peak-to-peak amplitude can vary from rail to rail voltages down to several mV amplitude depending on the field strength and on the distance to the transmitting device, respectively.

Second, the carrier frequency of 13.56 MHz is quite close to the baseband signal frequencies (which ranges up to 848 kHz). This makes the design of filters for suppressing the carrier signal rather complex. A typical approach for demodulation is rectification by means of a peak detector using a diode. The disadvantage of this approach is that the rectification has bad efficiency for small carrier amplitudes which limits the operating range.

Yet another approach would be synchronous demodulation with a mixer and a low pass filter. This known technology typically needs rather complex and power consuming components like a clock source (crystal, PLL) with low phase noise, mixers and a filter.

WO 97/48180 discloses an envelope detector including sample-and-hold circuitry controlled by preceding carrier pulse peaks. A sampling synchronous envelope detector adopts a specialized sample-and-hold ("S&H") approach, basing a detected output on instantaneous values of the carrier waveform which are sampled at specially chosen instants. Non-linear distortion is avoided by timing the sampling instants to occur at or near a carrier wave peak which is subsequent to an earlier carrier wave peak which serves as a time base. Sampling instants occur only at or near positive carrier peaks (or only at or near negative peaks) in a half-wave embodiment, and sampling instants occur at or near both positive and negative carrier peaks in a full wave embodiment. Another aspect of the detector provides means, such as a phase locked loop, for ensuring that the phase of the sampling instants is maintained continuously, even in the event of carrier pinch-off or other event which distorts or minimizes the carrier waveform from which the timing instants would otherwise be determined. Still another aspect of the detector provides for low pass filtering, and group delay equalization of the filtered signal, before it is output.

The known device, however, uses an approach to delay the sampling point by constant delay times to a time point close to the peak of the signal to be sampled, but not exactly to the peak of the signal. There is no provision to adapt the delay times such that sampling takes place exactly at the occurrences of the peaks of the signal to be sampled.

OBJECT AND SUMMARY OF THE INVENTION

It is an object of the invention to provide a demodulation circuit for ASK coded or amplitude modulated signals of the type defined in the opening paragraph, in which the disadvantages defined above are avoided.

It is a further object of the invention to provide an NFC device and an RFID transponder and a device of the type defined in the second paragraph.

In order to achieve the object defined above, with a demodulation circuit for ASK coded or amplitude modulated signals according to the invention characteristic features are provided so that a demodulation circuit for ASK coded or AM signals according to the invention can be characterized in the way defined below, that is:

A demodulation circuit for ASK coded or amplitude modulated signals comprising:

a circuit input being adapted to receive an ASK coded or AM signal comprising a carrier signal being ASK coded according to a base band signal or amplitude modulated, a first sampling mixer having a sampling signal input connected to the circuit input to receive the ASK coded or AM signal, a sampling clock input being adapted to receive a first sampling clock signal that defines first sampling points at which the ASK coded or AM signal when being present at the sampling signal input is sampled, and a sampling signal output being adapted to output the sampled signal, signal shaping means having a signal input connected to the circuit input and being adapted to provide a recovered clock signal at an output thereof, signal delay means being adapted to receive the recovered clock signal and to variably delay the recovered clock signal according to a delay control signal at a delay control input of the signal delay means, thereby generating a delayed recovered clock signal at an output thereof, wherein the delayed recovered clock signal is provided as the first sampling clock signal to the sampling clock input of the first sampling mixer, and amplitude maximum detection means being adapted to detect if the first sampling points of the first sampling mixer correspond to respective amplitude maxima of the signal being sampled and to generate the delay control signal being indicative for deviations in time of the first sampling points from said amplitude maxima, wherein the delay control signal is fed to the delay control input of the signal delay means to increase or decrease the delay added to the recovered clock signal in order to adjust the delayed recovered clock signal such that the first sampling points are set to the amplitude maxima of the signal being sampled by the first sampling mixer.

In order to achieve the object defined above, an NFC device and an RFID transponder according to the invention comprise a demodulation circuit for ASK coded or AM signals with the characteristic features according to the present invention.

The characteristic features according to the invention provide the advantage that the demodulation circuit is suitable for large carrier amplitude ranges, i.e. it works from rail to rail carrier amplitudes at its input down to very small amplitude voltages.

Another advantage of the invention is its good carrier suppression in that theoretically no carrier frequency component at all is left at the output. This eases filter design for the baseband signal treatment stages behind the demodulator.

Yet another advantage of the present invention is an optimum recovering of baseband signals meaning that the full amplitude information is recovered. Especially for small input signals this allows much higher sensitivity compared to a diode based peak detection demodulator.

Further, sampling at maximum amplitudes as achieved with the present invention results in relaxed phase noise requirements to clock generation. Mathematically the derivative at the respective maximum of the input signal—which is usually a sine wave signal or close to that—is zero. Therefore, jitter of the sampling clock has only very small influence on the baseband signal.

Easy and exact signal processing is guaranteed when the signal shaping means are adapted to convert the ASK coded or AM signals into a recovered rectangular clock signal. In order to achieve this by means of simple and cheap components that can easily be implemented in integrated circuits it is suggested to configure the signal shaping means as a limiting amplifier.

In another embodiment of the invention the signal delay means are integrated in the signal shaping means. This embodiment contributes to reduce the number of components, since it is not longer necessary to design dedicated signal delay means.

In yet another embodiment of the invention it is suggested to adapt the signal shaping means to variably delay the recovered clock signal according to a delay control signal generated by the amplitude maximum detection means, wherein the delay control signal is indicative for deviations in time of the first sampling points from said amplitude maxima, for increasing or decreasing the delay added to the recovered clock signal in order to adjust the delayed recovered clock signal such that the first sampling points are set to the amplitude maxima of the signal being sampled by the first sampling mixer. With such an embodiment both the signal shaping means and the signal delay means can be controlled by the amplitude maximum detection means, either by the same delay control signal or by independently generated delay control signals.

In principle, the frequency of the first sampling clock signal could be adjusted to an integer fraction of the frequency of the carrier frequency of the ASK coded or AM signal. Such an implementation would result in sampling the input signal in respective integer multiples of the period of the carrier signal, enabling to use low performance sampling mixers. However, in order to achieve the fastest detection of a change of the maximum amplitude it is preferred to configure the demodulation circuit such that the frequency of the first sampling clock signal is equal to that of the carrier frequency of the ASK coded or AM signal.

Accurate delay control is achieved when the signal delay means are configured as voltage or current controlled signal delay means, wherein the delay control input thereof is adapted to receive a DC voltage or current as a delay control signal. Additional advantages of this proposal are that voltage or current controlled signal delay means can easily be implemented in integrated circuits and that the generation of the delay control signal as a varying DC voltage or current can be implemented with only a few and cheap components.

In order to find an easily detectable condition for "Sampling at the Maximum Amplitude" it is further suggested to introduce a second sampling mixer (Q-channel mixer) which uses a second sampling clock signal that is phase shifted to the first sampling clock signal. The phase shift is set such that when the first sampling mixer is sampling at the maximum amplitude, the second sampling mixer is sampling at the zero crossings of the input. This gives a condition for a detection at the maximum amplitude. Zero crossings are to detect easier and with higher accuracy than amplitude maxima. The suggested configuration of the demodulation circuit has amplitude maximum detection means comprising:

a second sampling mixer having a sampling signal input connected to the circuit input to receive the ASK coded or AM signal, a sampling clock input being adapted to receive a second sampling clock signal that defines second sampling points at which the ASK coded or AM signal when being present at the sampling signal input is sampled, and a sampling signal output being adapted to output the sampled signal, clock generation means for generating the second sampling clock signal having such a phase shift in respect of the first sampling clock signal that the second sampling clock signal defines second sampling points corresponding to zero-crossings of the signal being sampled when the first sampling points correspond to respective amplitude maxima of the signal being sampled, and zero detection means being adapted to detect if the second sampling points of the second sampling mixer correspond to zero-crossings of the signal being sampled and to generate a delay control signal being indicative for deviations in time of the second sampling points from said zero-crossings, wherein the delay control signal is fed to the delay control input of the signal delay means to increase or decrease the delay added to the recovered clock signal in order to adjust the delayed recovered clock signal such that the second sampling points are set to the zero crossings of the signal being sampled by the second sampling mixer.

It is suggested to fix the phase shift between the first sampling clock signal and the second sampling clock signal to one quarter of the carrier signal period which corresponds to 90°. So in steady state the first mixer (also denoted I-channel mixer) is sampling at the maximum amplitude and the second sampling mixer (also denoted Q-channel mixer) is sampling at the zero crossings of the sine wave input.

A preferred embodiment of the zero detection means which only requires a few components that can at low efforts and costs be implemented in integrated circuits comprises a differential amplifier having a first input connected to the output of the second sampling mixer and a second input connected to ground.

The concept of the present invention can also be extended to a fullwave implementation with differential outputs of the first and/or the second sampling mixer. In such a demodulation circuit the first sampling mixer and/or the second sampling mixer comprise a first sampling channel and a second sampling channel with outputs that are configured as differential outputs wherein the first sampling channel is controlled by the first sampling clock signal or the second sampling clock signal, respectively, and the second sampling channel is controlled by an inverted sampling clock signal of the first or the second sampling clock signal, thereby defining third sampling points and/or fourth sampling points that are phase shifted by 180° degrees to the first sampling clock signal or the second sampling clock signal, respectively. Thereby, the first sampling mixer delivers the envelope signal of the ASK coded signal RX as a differential signal wherein the first sampling channel follows the positive amplitude peaks and the second sampling channel follows the negative amplitude peaks. It will be appreciated that the output signal of the differential output is twice as high as the output of a halfwave sampling mixer, therefore yielding higher accuracy.

The aspects defined above and further aspects of the invention are apparent from the exemplary embodiment to be described hereinafter and are explained with reference to this exemplary embodiment.

BRIEF DESCRIPTION OF THE DRAWINGS

The invention will be described in more detail hereinafter with reference to an exemplary embodiment. However, the invention is not limited to this exemplary embodiment.

DESCRIPTION OF EMBODIMENTS

The basic idea of the demodulation circuit according to the invention is to use a sampling mixer which directly converts the RF signal at a circuit input of the demodulation circuit to the baseband signal of the RF signal, wherein the clock signal needed for this sampling mixer is derived from the RF signal.

Figure 1:
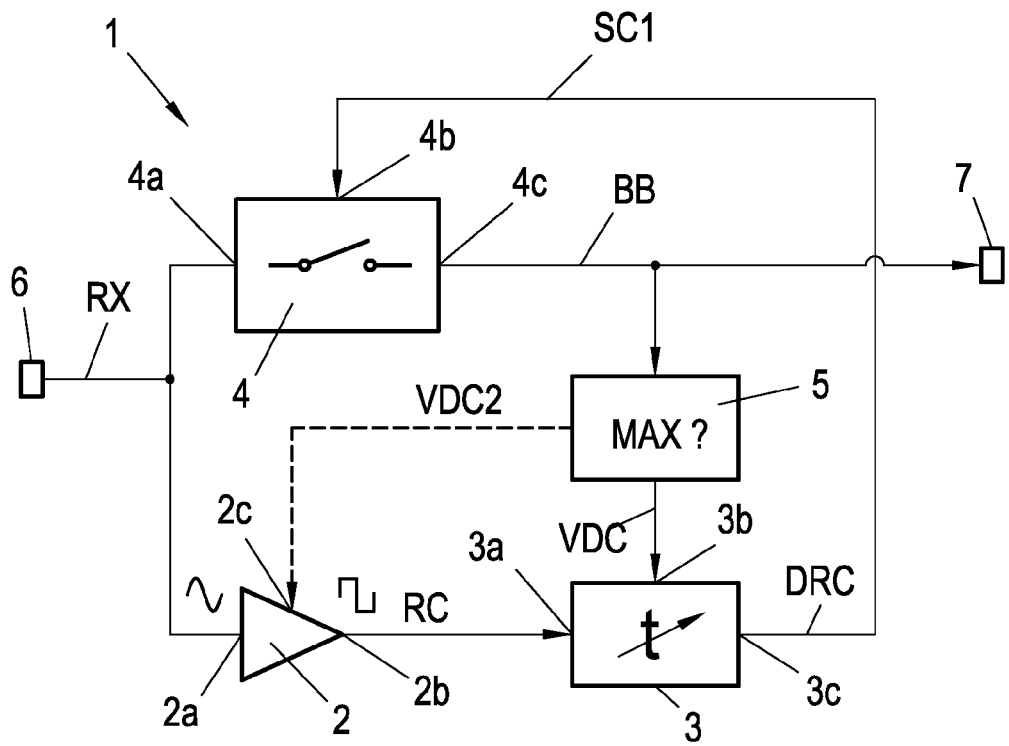
FIG. 1 shows a block circuit diagram of the basic function of the invention.
Figure 2:
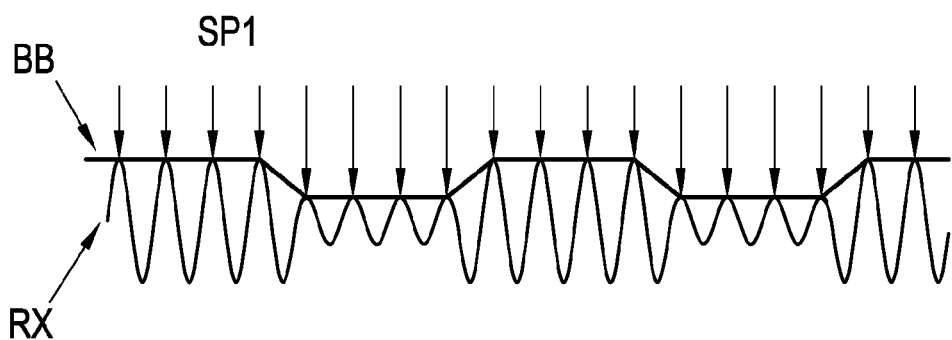
FIG. 2 shows a timing diagram of an ASK coded input signal and the sampling points of this signal.

FIG. 1 shows a block circuit diagram of an implementation of the basic function of this invention. The demodulation circuit 1 is adapted to demodulate ASK coded signals RX or amplitude modulated (AM) signals being received at a circuit input 6. It should be observed, that for the sake of simplicity the following description specifically refers to ASK coded signals RX. However, the invention is generally applicable to the demodulation of any form of ASK coded or amplitude modulated (AM) signals. Hence, the term "ASK coded signals RX" used herein is to be understood in a broad sense also comprising amplitude modulated signals. The ASK coded signal RX comprises a carrier signal being ASK coded according to a base band signal BB as can be seen from the timing diagram of FIG. 2. The demodulation circuit 1 comprises a first sampling mixer 4 having a sampling signal input 4a connected to the circuit input 6 to receive the ASK coded signal RX. The first sampling mixer 4 further comprises a sampling clock input 4b being adapted to receive a first sampling clock signal SC1 that defines first sampling points SP1 at which the ASK coded signal RX is sampled, and a sampling signal output 4c being adapted to output the sampled signal BB and an circuit output 7 for further processing. The described signals are depicted in FIG. 2.

The demodulation circuit 1 further comprises signal shaping means 2 having a signal input 2a connected to the circuit input 6 and being adapted to convert the generally sine wave ASK coded signal RX received at its signal input 2a into a rectangular recovered clock signal RC having the same frequency than the carrier signal within the ASK coded signal RX. The recovered clock signal RC is provided at an output 2b of the signal shaping means 2, which output is connected to the input 3a of signal delay means 3. The signal shaping means 2 are preferably configured as a limiting amplifier.

The signal delay means 3 are adapted to variably delay the recovered clock signal RC according to a delay control signal VDC being received at a delay control input 3b of the signal delay means 3, thereby generating a delayed recovered clock signal DRC at an output 3c of the signal delay means 3. The output 3c of the signal delay means 3 is connected to the sampling clock input 4b of the first sampling mixer 4 so that it serves as the first sampling clock signal SC1 to the sampling clock input 4b of the first sampling mixer 4, determining the first sampling points SP1.

The demodulation circuit 1 further comprises amplitude maximum detection means 5 being adapted to detect if the first sampling points SP1 of the first sampling mixer 4 correspond to respective amplitude maxima of the ASK coded signal RX being sampled and to generate the delay control signal VDC being indicative for deviations in time of the first sampling points SP1 from said amplitude maxima. The delay control signal VDC is fed to the delay control input 3b of the signal delay means 3 causing either maintaining the present signal delay or an increase or decrease of the delay added to the recovered clock signal RC in order to adjust the delayed recovered clock signal DRC such that the first sampling points SP1 are accurately set to the amplitude maxima of the ASK coded signal RX being sampled by the first sampling mixer 4. In the present embodiment the signal delay means 3 are configured as voltage controlled signal delay means being adapted to receive a DC voltage as a delay control signal VDC. However, it should be noted that the signal delay means 3 can also be configured as current controlled signal delay means being adapted to receive a DC current as a delay control signal VDC. It should further be noted, that the signal delay means 3 need not necessarily be configured as a dedicated component, but could also be incorporated in the signal shaping means 2. Further, also the signal shaping means 2 can be adapted to variably delay the recovered clock signal RC according to either the delay control signal VDC (not shown in the drawing) or another delay control signal VDC2 generated by the amplitude maximum detection means 5. With such an embodiment both the signal shaping means 2 and the signal delay means 3 can be controlled by the amplitude maximum detection means 5, either by the same delay control signal VDC or by independently generated delay control signals VDC, VDC2.

Figure 3:
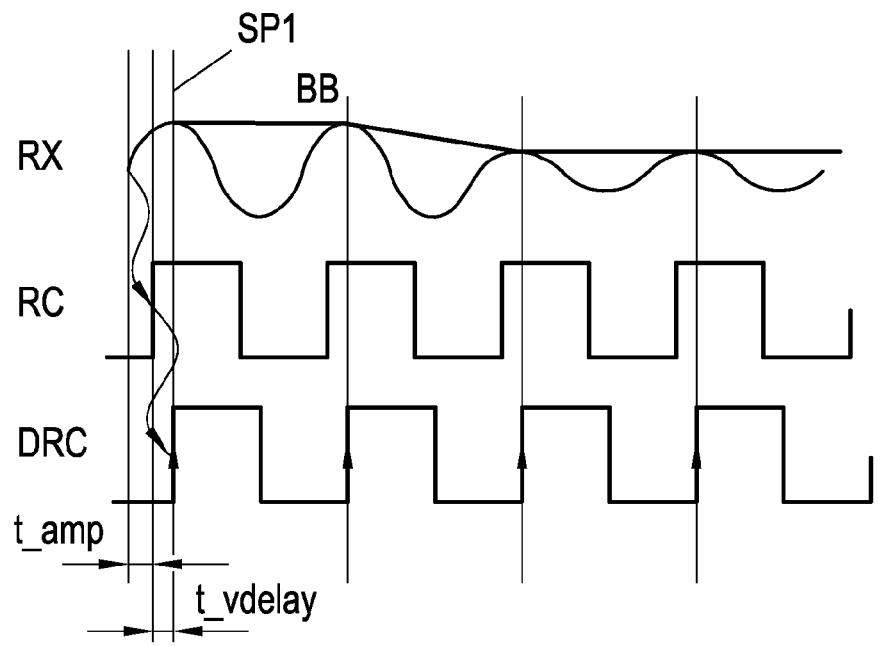
FIG. 3 shows in a timing diagram a sampling of the input signal at rising clock edges of a sampling clock signal.

Now turning to the timing diagram of FIG. 3 the function of the signal delay means 3 is explained. The first line of the diagram of FIG. 3 depicts the ASK coded signal RX comprising a baseband signal BB that forms an envelope of the ASK coded signal RX. The second line of the timing diagram depicts the recovered clock signal RC that is output from the signal shaping means 2. The bottom line of the timing diagram represents the delayed recovered clock signal DRC that is output from the signal delay means 3 and fed to the sampling clock input 4b of the first sampling mixer 4. As has already been explained above, the square wave recovered clock signal RC is generated from the sine wave ASK coded signal RX by means of the signal shaping means 2 configured as a limiting amplifier. This recovered clock signal RC has a certain delay t_amp in respect of the ASK coded signal RX which delay t_amp usually depends on the amplitude of the input signal of the signal shaping means 2, i.e. the ASK coded signal RX. The signal delay means 3 variably shift the recovered clock signal RC in phase, or in other words add a further delay t_vdelay to the recovered clock signal RC. This delay t_vdelay is adjusted automatically by the amplitude maximum detection means 5 such that the ASK coded signal RX is always sampled by the first sampling mixer 4 at the amplitude maximum, i.e. that the first sampling points SP1 lie at the amplitude maxima. To achieve this the amplitude maximum detection means 5 measure if the first sampling mixer 4 is already sampling at the maximum, and if necessary, control the signal delay means 3 to increase/decrease the delay t_vdelay appropriately. Consequently, the signal at the output 4c of the sampling mixer 4 denoted BB is following the amplitude of the ASK coded signal RX and therefore represents the baseband envelope signal BB with the full amplitude information and the carrier completely removed. The baseband signal BB then can be passed to an ADC for digital signal processing. If necessary it could be amplified before.

Figure 4:
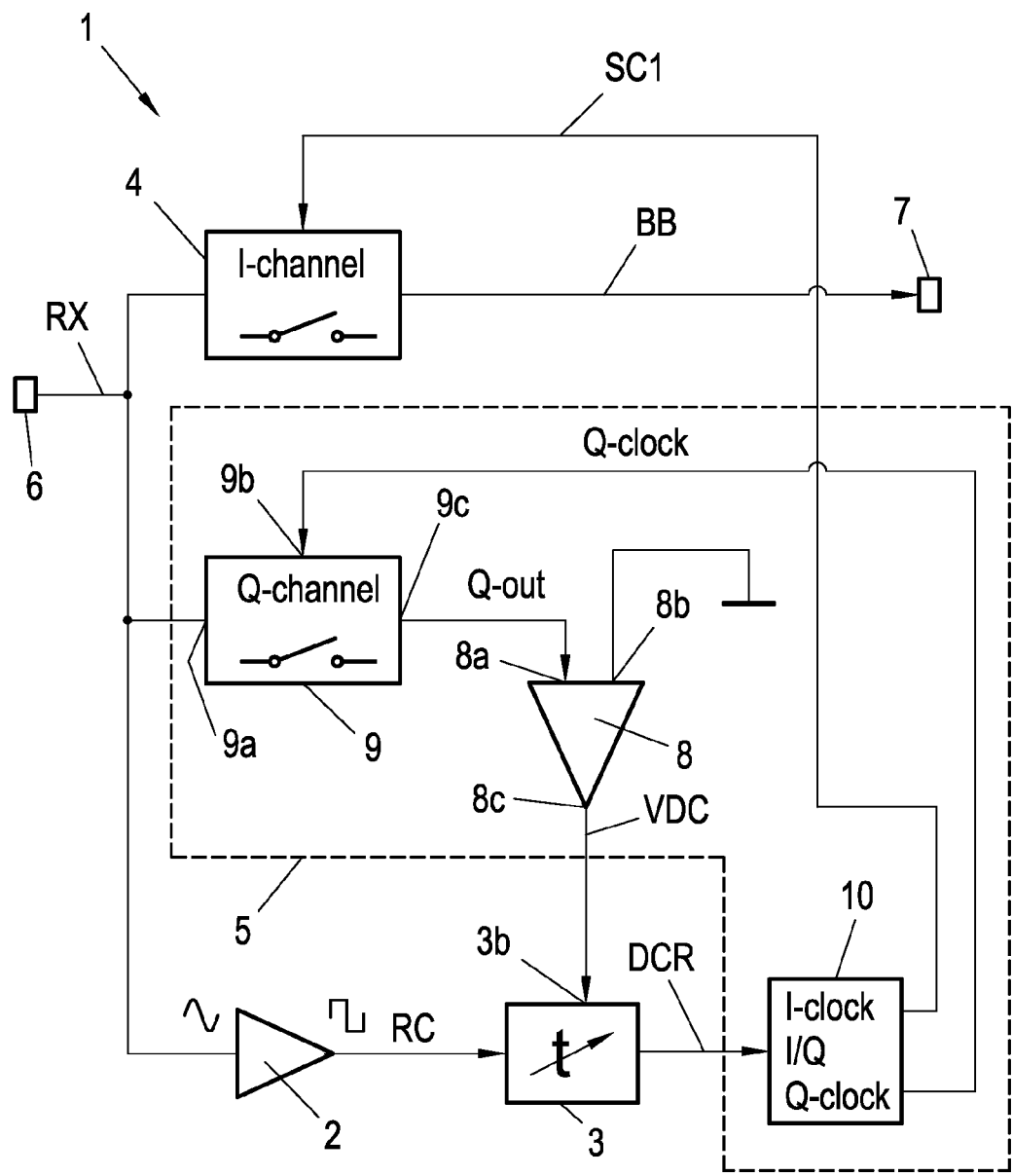
FIG. 4 shows a block diagram of an embodiment of an ASK demodulator according to the present invention.

A block circuit of the demodulation circuit 1 with a possible implementation of the amplitude detection means 5 is shown in FIG. 4. In this embodiment the amplitude maximum detection means 5 comprise a second sampling mixer 9 having a sampling signal input 9a connected to the circuit input 6 to receive the ASK coded signal RX. The second sampling mixer 9 further comprises a sampling clock input 9b being adapted to receive a second sampling clock signal Q-clock that defines second sampling points SP2 (see FIG. 5) at which the ASK coded signal RX is sampled by the second sampling mixer 9, wherein the sampled signals Q-out are output at a sampling signal output 9c of the second sampling mixer 9.

Clock generation means 10 generate the second sampling clock signal Q-clock such that it has a fixed phase shift Φ of 90° in respect of the first sampling clock signal SC1 (which is also denoted I-clock). Hence, as illustrated in the timing diagram of FIG. 5, due to the fact that the ASK coded signal RX is a sine wave signal, the second sampling clock signal Q-clock defines second sampling points SP2 corresponding to zero-crossings of the ASK coded signal RX. So, in steady state, the first sampling mixer 4 (denoted I-channel mixer) is sampling at the maximum amplitude while the second sampling mixer 9 (denoted the Q-channel mixer) is sampling at the zero crossings of the sine wave input signal RX. This gives a condition for detecting whether the first sampling mixer 4 is sampling by detecting whether the second sampling mixer 9 is sampling at zero crossings. This condition is used in the regulation loop described below.

The amplitude maximum detection means 5 further comprise zero detection means 8 being adapted to detect if the second sampling points SP2 of the second sampling mixer 9 correspond to zero-crossings of the ASK coded signal RX being sampled by the second sampling mixer 9, and to generate the delay control signal VDC (now being indicative for deviations in time of the second sampling points SP2 from said zero-crossings). The delay control signal VDC is fed to the delay control input 3b of the signal delay means 3 to cause an increase or decrease of the delay t_vdelay added by the signal delay means 3 to the recovered clock signal RC in order to adjust the delayed recovered clock signal DRC such that the second sampling points SP2 are set to the zero crossings of the signal being sampled by the second sampling mixer 9. It will be appreciated that due to the sine wave nature of the ASK coded signal RX sampling the zero crossings at the second sampling points SP2 and sampling the maximum amplitudes at sampling points SP1 have a fixed relation within the period of the sine signal RX. Hence, detecting the correctness of the sampling points either by monitoring the maximum amplitudes at first sampling points SP1 or by monitoring the zero crossings at second sampling points SP2 is fully interchangeable and equivalent. However, it is easier to detect zero crossings and therefore the present embodiment has been suggested.

In the present example the zero detection means 8 are configured as a differential amplifier having a first input 8a connected to the output 9c of the second sampling mixer 9 and a second input 8b connected to ground, i.e. zero potential. Any deviation of the output signal Q-out of the second sampling mixer 9 results in an output signal deviating from zero at the output 8c of the differential amplifier 8 which output signal is used as the delay control signal VDC. Strictly speaking, if signal Q-out is positive (sampling occurs to early in the second sampling mixer) the voltage of delay control signal VDC is increased to increase the delay t_vdelay. This moves the second sampling points SP2 closer to the zero crossings of the ASK coded signal RX and consequently the voltage of the signal Q-out will decrease and approach zero. Whenever signal Q-out is negative (sampling occurs too late) the voltage of delay control signal VDC is decreased, consequently decreasing the delay t_vdelay moving the second sampling points SP2 closer to the zero crossings of ASK coded signal RX. The voltage of signal Q-out will increase and approach zero. The output signal BB of the first sampling mixer 4 is then automatically following the maximum amplitude and therefore equal to the envelope of the ASK coded signal RX.

The clock generation means 10 are configured as I/Q-clock generation means with the Q-clock being phase shifted by 90° to the I-clock. The I/Q-clock generation means could be implemented by means of a Delay Locked Loop (DLL) which generates the quadrature clocks.

Figure 5:
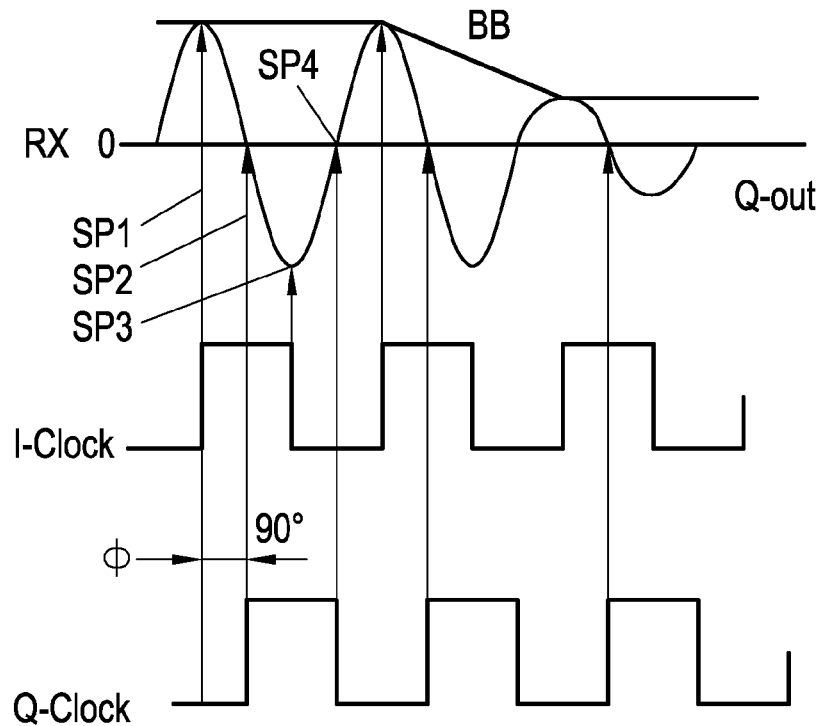
FIG. 5 shows a timing diagram of I/Q-channel sampling for maximum detection according to the present invention.

The concept of the present invention can also be extended to a fullwave implementation with differential outputs of the first and/or the second sampling mixer. In such an embodiment of the demodulation circuit the first sampling mixer 4 and/or the second sampling mixer 9 are configured as fullwave mixers comprising a first sampling channel and a second sampling channel with outputs that are configured as differential outputs. The first sampling channel of the first sampling mixer 4 is controlled by the first sampling clock signal SC1 as shown in FIG. 1 and FIG. 4. The first sampling channel of the second sampling mixer 9 is controlled by the second sampling clock signal (Q-clock). The second sampling channels of each of the first and second sampling mixers 4, 9 are controlled by an inverted sampling clock signal of the first or the second sampling clock signal, respectively, thereby defining third sampling points SP3 for the first sampling mixer 4 and fourth sampling points SP4 for the second sampling mixer 9. The third and the fourth sampling points SP3, SP4 are shown in the diagram of FIG. 5. It will be appreciated that the inverted sampling clock signals of sampling points SP3, SP4 are phase shifted by 180° degrees to the first sampling clock signal SC1 and the second sampling clock signal Q-clock, respectively. Therefore, the first sampling mixer 4 then delivers the envelope signal of the ASK coded signal RX as a differential signal wherein the first sampling channel follows the positive amplitude peaks and the second sampling channel follows the negative amplitude peaks. The invention is intended to be applied in Near Field Communication integrated circuits to implement card mode i.e. the device is operated in the 13.56 MHz field of another device which is generating that field and sending data or a command by means of ASK modulation. It should be observed that the invention can also generalized to the demodulation of any form of ASK and AM signals.

Finally, it should be noted that the above-mentioned embodiments illustrate rather than limit the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. In a device claim enumerating several means, several of these means may be embodied by one and the same item of software or hardware. The mere fact that certain measures are recited in mutually different dependent claims does not indicate that a combination of these measures cannot be used to advantage.

The invention claimed is:

1. A demodulation circuit for ASK coded or amplitude modulated signals comprising:
   a circuit input being adapted to receive an ASK coded or AM signal comprising a carrier signal being ASK coded according to a base band signal or amplitude modulated;
   a first sampling mixer having a sampling signal input connected to the circuit input to receive the ASK coded or AM signal, a sampling clock input being adapted to receive a first sampling clock signal that defines first sampling points at which the ASK coded or AM signal when being present at the sampling signal input is sampled, and a sampling signal output being adapted to output the sampled signal;
   signal shaping means having a signal input connected to the circuit input and being adapted to provide a recovered clock signal at an output thereof;
   signal delay means being adapted to receive the recovered clock signal and to variably delay the recovered clock signal according to a delay control signal at a delay control input of the signal delay means, thereby generating a delayed recovered clock signal at an output thereof, wherein the delayed recovered clock signal is provided as the first sampling clock signal to the sampling clock input of the first sampling mixer; and
   amplitude maximum detection means being adapted to detect if the first sampling points of the first sampling mixer correspond to respective amplitude maxima of the signal being sampled and to generate the delay control signal being indicative for deviations in time of the first sampling points from said amplitude maxima, wherein the delay control signal is fed to the delay control input of the signal delay means to increase or decrease the delay added to the recovered clock signal in order to adjust the delayed recovered clock signal such that the first sampling points are set to the amplitude maxima of the signal being sampled by the first sampling mixer.

2. A demodulation circuit as claimed in claim 1, wherein the signal shaping means are adapted to convert the ASK coded or AM signals into a rectangular recovered clock signal.

3. A demodulation circuit as claimed in claim 2, wherein the signal shaping means are configured as a limiting amplifier.

4. A demodulation circuit as claimed in claim 1, wherein the signal delay means are integrated in the signal shaping means.

5. A demodulation circuit as claimed in claim 1, wherein the signal shaping means are adapted to variably delay the recovered clock signal according to a delay control signal generated by the amplitude maximum detection means wherein the delay control signal is indicative for deviations in time of the first sampling points from said amplitude maxima, for increasing or decreasing the delay added to the recovered clock signal in order to adjust the delayed recovered clock signal such that the first sampling points are set to the amplitude maxima of the signal being sampled by the first sampling mixer.

6. A demodulation circuit as claimed in claim 1, wherein the frequency of the first sampling clock signal is substantially equal to that of the carrier frequency of the ASK coded or AM signal.

7. A demodulation circuit as claimed in claim 1, wherein the signal delay means are configured as voltage or current controlled signal delay means, wherein the delay control input thereof is adapted to receive a DC voltage or current as a delay control signal.

8. A demodulation circuit as claimed in claim 1, wherein the amplitude maximum detection means comprise:
   a second sampling mixer having a sampling signal input connected to the circuit input to receive the ASK coded or AM signal, a sampling clock input being adapted to receive a second sampling clock signal that defines second sampling points at which the ASK coded or AM signal when being present at the sampling signal input is sampled, and a sampling signal output being adapted to output the sampled signal, clock generation means for generating the second sampling clock signal having such a phase shift ($\Phi$) in respect of the first sampling clock signal that the second sampling clock signal defines second sampling points corresponding to zero-crossings of the signal being sampled when the first sampling points correspond to respective amplitude maxima of the signal being sampled,
   and zero detection means being adapted to detect if the second sampling points of the second sampling mixer correspond to zero-crossings of the signal being sampled and to generate a delay control signal being indicative for deviations in time of the second sampling points from said zero-crossings, wherein the delay control signal is fed to the delay control input of the signal delay means to increase or decrease the delay added to the recovered clock signal in order to adjust the delayed recovered clock signal such that the second sampling points are set to the zero crossings of the signal being sampled by the second sampling mixer.

9. A demodulation circuit as claimed in claim 8, wherein the phase shift between the first sampling clock signal and the second sampling clock signal is fixed to 90°.

10. A demodulation circuit as claimed in claim 8, wherein the zero detection means are configured as a differential amplifier having a first input connected to the output of the second sampling mixer and a second input connected to ground.

11. A demodulation circuit as claimed in claim 1, wherein the first sampling mixer or the second sampling mixer are configured as fullwave mixers comprising a first sampling channel and a second sampling channel having outputs that are configured as differential outputs wherein the first sampling channel is controlled by the first sampling clock signal or the second sampling clock signal, respectively, and the second sampling channel is controlled by an inverted sampling clock signal of the first or the second sampling clock signal, thereby defining third sampling points and/or fourth sampling points that are phase shifted by 180° degrees to the first sampling clock signal or the second sampling clock signal, respectively.

12. An NFC device, comprising a demodulation circuit according to claim 1.

13. An RFID transponder, comprising a demodulation circuit according to claim 1.

* * * * *